United States Patent
Chang et al.

(10) Patent No.: US 8,091,000 B2
(45) Date of Patent: Jan. 3, 2012

(54) DISABLING PORTIONS OF MEMORY WITH DEFECTS

(75) Inventors: Tsung-Yung (Jonathan) Chang, Cupertino, CA (US); Durgesh Srivastava, Santa Clara, CA (US); Jonathan Shoemaker, Sunnyvale, CA (US); John Benoit, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/540,602

(22) Filed: Aug. 13, 2009

(65) Prior Publication Data

US 2009/0300413 A1    Dec. 3, 2009

Related U.S. Application Data

(62) Division of application No. 11/472,870, filed on Jun. 21, 2006, now abandoned.

(51) Int. Cl.
*G11C 29/00* (2006.01)
*G06F 12/08* (2006.01)

(52) U.S. Cl. .............. 714/723; 714/710; 711/3

(58) Field of Classification Search .......... 714/723, 714/718, 702, 710, 724; 365/200, 201
See application file for complete search history.

(56) References Cited

U.S. PATENT DOCUMENTS

| | | | | |
|---|---|---|---|---|
| 6,006,311 A * | 12/1999 | Arimilli et al. | ............ | 711/133 |
| 6,035,436 A * | 3/2000 | Wu et al. | ............ | 714/797 |
| 6,405,332 B1 * | 6/2002 | Bando et al. | ............ | 714/723 |
| 6,460,152 B1 * | 10/2002 | Demidov et al. | ............ | 714/723 |
| 6,564,345 B1 * | 5/2003 | Kim et al. | ............ | 714/723 |
| 6,643,807 B1 * | 11/2003 | Heaslip et al. | ............ | 714/719 |
| 6,718,494 B1 * | 4/2004 | Jamil et al. | ............ | 714/723 |
| 6,842,874 B1 * | 1/2005 | Voshell | ............ | 714/723 |
| 6,901,542 B2 * | 5/2005 | Bartenstein et al. | ............ | 714/719 |
| 6,922,798 B2 * | 7/2005 | Nemani et al. | ............ | 714/710 |
| 6,993,692 B2 * | 1/2006 | Ouellette et al. | ............ | 714/723 |
| 6,996,766 B2 * | 2/2006 | Cypher | ............ | 714/764 |
| 7,007,210 B2 * | 2/2006 | Fields et al. | ............ | 714/718 |
| 7,035,470 B2 * | 4/2006 | Wong et al. | ............ | 382/233 |
| 7,058,864 B1 * | 6/2006 | McHardy et al. | ............ | 714/723 |
| 7,162,669 B2 * | 1/2007 | Gross | ............ | 714/710 |
| 7,168,010 B2 * | 1/2007 | Yadavalli et al. | ............ | 714/42 |
| 7,228,386 B2 * | 6/2007 | Rowlands et al. | ............ | 711/128 |
| 7,346,815 B2 * | 3/2008 | Nowicki | ............ | 714/710 |
| 2003/0018936 A1 * | 1/2003 | Ryan et al. | ............ | 714/723 |
| 2005/0050410 A1 * | 3/2005 | Pomaranski et al. | ............ | 714/723 |
| 2005/0160326 A1 * | 7/2005 | Boatright et al. | ............ | 714/47 |

OTHER PUBLICATIONS

U.S. Patent and Trademark Office, Office Action mailed Aug. 16, 2011 in U.S. Appl. No. 12/614,535.
U.S. Patent and Trademark Office, Reply to Office Action (Mailed Aug. 16, 2011) filed on Nov. 15, 2011 in U.S. Appl. No. 12/614,535.

* cited by examiner

*Primary Examiner* — Jeffrey A Gaffin
*Assistant Examiner* — Daniel McMahon
(74) *Attorney, Agent, or Firm* — Trop, Pruner & Hu, P.C.

(57) ABSTRACT

An apparatus and methods are disclosed herein for identifying and avoiding attempts to access a defective portion of memory. Errors associated with portions of memory, such as a cache memory, are tracked over time enabling detection of both hard and erratic errors. Based on the number of errors tracked over time for a portion of memory, it is determined if the portion of memory is defective. In response to determining portion of memory is defective, the portion of memory is disabled. The portion of memory may be flushed and moved before being disable. Additionally, disabling the portion of memory may be conditioned upon determining if it is allowable to disable the portion of memory.

26 Claims, 6 Drawing Sheets

DISABLING PORTIONS OF MEMORY WITH DEFECTS

The present patent application is a Divisional Application of application Ser. No. 11/472,870, filed Jun. 21, 2006 now abandoned.

BACKGROUND OF THE INVENTION

Data storage, referred to generically herein as "memory," is commonly implemented in computer systems. Computer systems may employ a multi-level hierarchy of memory, with relatively fast, expensive but limited-capacity memory at the lowest level of the hierarchy and proceeding to relatively slower, lower cost but higher-capacity memory at the highest level of the hierarchy. The hierarchy may include a fast memory called a cache, either physically integrated within a processor or mounted physically close to the processor for speed. In addition, the computer system may use multiple levels of caches.

From time-to-time a defect may occur within a portion of memory. Such defect may occur and be detected during manufacturing (or "fabricating") the memory, or such defect may be a latent defect that is not observed until after the memory chip has been supplied by the manufacturer. Latent defects may be caused, for example, by aging, stresses, and/or actual use of the memory, which results in errors from the point of view of the memory. Thus, latent defects refer to defects that were not present (or did not manifest themselves) during the testing and production of the memory. Some latent defects manifest themselves as hard errors which consistently fail when tested for. Other latent defects manifest themselves as erratic errors which fail inconsistently.

Latent defects in memory if not detected, corrected, or avoided, will cause a running program accessing that portion of memory to crash. Especially in systems expected to have high uptimes (high availability systems), this is not acceptable. In addition, it is not acceptable to severely limit the performance of such systems. Therefore there is a need for methods to detect, correct, or avoid latent defects in memory (whether they manifest themselves as hard or erratic errors) while not limiting performance of the system.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

Figure 1:
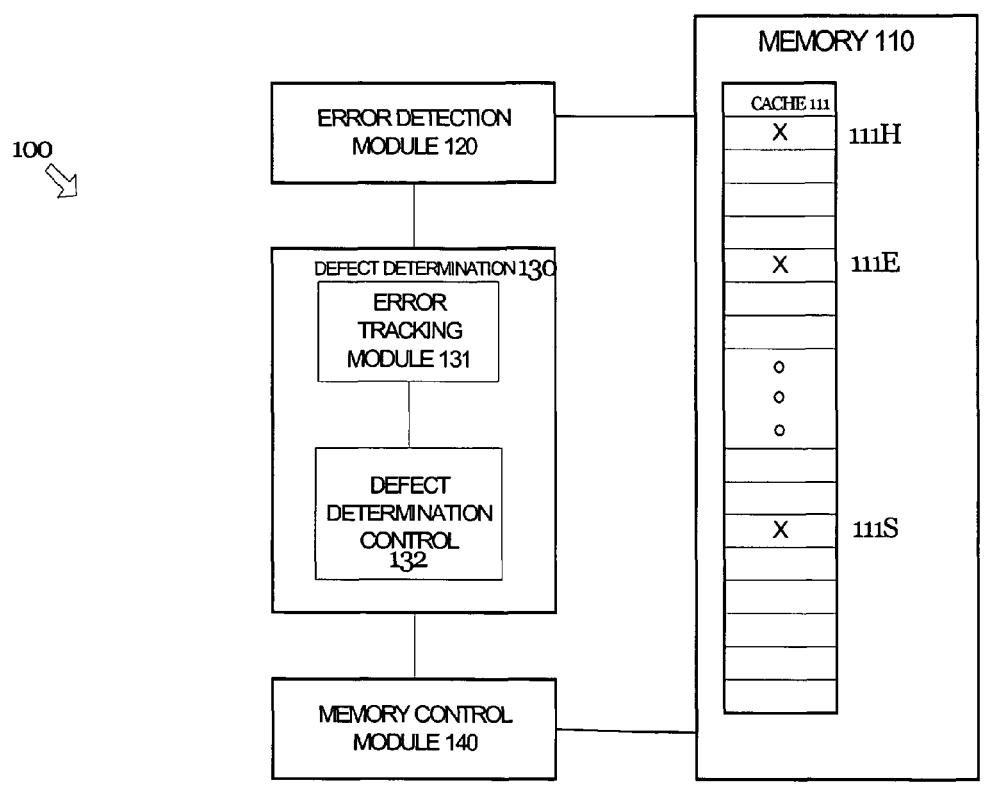
FIG. 1 shows a block diagram of an exemplary system employing an embodiment of disabling portions of memory with non-deterministic errors.

In general, systems and methods are disclosed herein for identifying and avoiding attempts to access a defective portion of memory. That is, techniques are provided for detecting a defect in a portion of memory and dynamically avoiding future attempts to access the defective portion of memory. More specifically, the following techniques detect and avoid both hard and erratic errors. The embodiments described herein are described in the context of a cache memory in a microprocessor, but are not so limited. The same techniques and teachings of the present invention may easily be applied to other types of circuits or semiconductor devices containing memory that may benefit from reliable access to memory. In addition, the methods of the present invention may be implemented in software or hardware as one of ordinary skill in the art will appreciate.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular details in order to not unnecessarily obscure the present invention.

Because computer systems and applications executing thereon rely heavily on accurate performance of memory for storing data, various techniques have been developed for detecting and correcting defects in memory. For example, error correction code (ECC) and/or parity checking techniques are commonly employed for detecting defective data in memory and/or correcting such defective data. ECC allows data that is being read or transmitted to be checked for errors and, when necessary, corrected on the fly. Generally, error correcting techniques, such as ECC are employed for single-bit correction. Double-bit (or greater) correction is often too complex/expensive to implement for a given system, although such error correction techniques may be employed if so desired.

An error detected in memory may be a soft error, an erratic error, or a hard error. Soft errors are fairly rare events caused, for example, by alpha particles or cosmic rays hitting the silicon and flipping a bit. Such soft errors are momentary (transient) events, rather than permanent defects, and so upon occurrence of such a soft error the memory cell may be rewritten and it may resume working properly.

An erratic error is an error that shows up non-deterministically. That is, an erratic error is one that occurs repeatedly but in a random or non-deterministic fashion. This type of error is difficult to test for during original manufacturing because the failure may not exhibit itself during testing but may still show up frequently enough in a system to cause unreliability. Such erratic errors may occur where there is a latent defect in the memory cell or with cells that have low voltage sensitivity, either of which can cause an error from time to time. Low voltage sensitivity is used herein to mean a susceptibility to failures at a minimum voltage for which the memory expected to be functional without errors. With hard errors, testing to determine a failure would reliably detect an error.

A technique referred to as inline ECC correction is employed in certain systems, wherein ECC correction is employed for correcting every memory access, not just the ones with a defect. In other systems, ECC may be employed only for detecting defects. ECC is often implemented to provide single-bit error correction and double bit error detection. If a system employing single bit error correction experiences a double-bit error, the system generally crashes the application accessing memory or in some instances the entire system. Thus, if only a single hard error is present for a bit of a memory address, such bit can be corrected each time it is accessed via ECC correction. If only an erratic error is present for a bit of memory address and the failure manifests itself during a memory access, such a failure can also be corrected via ECC correction. If single-bit correction is employed and a hard or erratic error is present for one bit of a memory location, then occurrence of a soft error or an additional erratic or hard error on another bit of the memory addressed results in a double-bit error that cannot be corrected and generally results in crashing the application of the system.

Embodiments of the present invention identify defects in memory which may not have been identified during manufacture and testing of the memory or defects that manifest later in the life of the memory. These defects may show up as either hard or erratic errors. The nondeterministic nature of erratic errors means other methods of identifying errors in memory are ineffective. In the following embodiments, the data stored in the defective portion of memory may be moved to another portion of memory. For instance, upon detecting a defect in a level of cache, the correct data may be written to main memory. The defective portion of memory is designated as defective (e.g., via stored data), and access control mechanisms avoid future access to such defective portions of memory. Accordingly, the overall size of memory is effectively reduced once the defective portion is designated as defective, as such defective portion is not available for future accesses. However, system performance can be maintained at a high level because the defective portion of memory is not accessed in the future and thus time need not be spent correcting data from such defective portion of memory. Furthermore, such defects generally arise fairly infrequently and thus relatively small portions of memory may become defective over the typical life of a system in which the memory is employed. In addition, when employing a single-bit error correction scheme, the exemplary techniques provided herein reduce the potential for later incurring a double-bit error because a hard or erratic single-bit error detected for a portion of memory results in that portion of memory designated as defective and not used for future accesses. Accordingly, system up time may be maintained while also maintaining a high level of performance.

FIG. 1 shows a block diagram of an exemplary system 100 employing an embodiment of the present invention. System 100 includes memory 110 having portions of cache or memory 111 which may, for example, include a portion with a hard error 111H, a portion with an erratic error 111E, and a portion with a soft error 111S. System 100 also includes error detection logic 120 which is operable to detect errors in portions of memory such as that found in 111H (a hard error), 111E (an erratic error), or 111S (a soft error). System 100 further includes a defect determination block 130. The defect determination block 130 is operable to determine if the errors detected in the error detection block 120 are defects and keeps track of which memory locations have been detected as having errors. Defects could be hard errors or erratic errors. The defect determination block 130 may contain an error tracking block 131 and a defect determination control block 132. The error tracking block 131 is operable to keep track of information about the errors detected in a portion of memory over time. It could contain both the address and information about the detected errors over time for portions of memory and is updated when an error is detected by error detection logic 120. The defect determination control block 132 determines if a detected error should indicate a defect in the portion of memory based on software or hardware inputs and the error information stored in the error tracking logic 120. If a portion of the memory is determined to be defective, data is stored designating the portion of memory defective. The memory control block 140 may move the data in the defective portion of memory elsewhere (e.g. to main memory or to a replacement portion of memory) and restricts future access to portions of memory determined to be defective.

Accordingly, when error detection logic 120 detects an error in a portion of the memory containing a hard error, such as portion 111H, error tracking logic 131 is updated to reflect the error for portion 111H. As this is a hard error, each time 111H is accessed, an error may be detected by error detection logic 120 and error tracking logic 131 is updated accordingly. Defect determination control logic 132 will then determine based on the error tracking logic 131 for portion 111H if it should be considered a defective portion of memory. If memory location 111H is determined to be defective, data is stored indicating the memory location as such. Memory control 140 then moves the data from 111H to a different location and restricts future access to memory location 111H.

Additionally, FIG. 1 illustrates how the present invention determines a defective memory location if the memory location experiences erratic errors. If error detection logic 120 detects an erratic error, such as in location 111E for the first time, error tracking logic 131 begins keeping track of errors detected for 111E. Because portion 111E contains an erratic failure, subsequent accesses to the same portion of memory may or may not exhibit an error that can be detected by error detection logic 120. If an error is not detected, operation resumes normally. If however, one or more subsequent errors are detected, error tracking logic 131 is updated to reflect the additional error(s) for portion 111E. Defect determination control logic 132 determines if the error should signify a defective portion of memory based on software or hardware controlled limits and the error information stored in error tracking logic 131 for portion 111E. The defect is detected even if repeated errors for the portion of memory are far apart in time or if there are many successful accesses to the portion of memory that do not exhibit a failure between two or more failures. If it is determined that portion 111E is defective, data is stored indicating the portion of memory as such. The memory control logic 140 may remove the data from 111E and restrict access to portion 111E in the future.

In case of a soft error, the portion of memory is not defective but experiences a random event such as a radiation strike which causes the error. These events are extremely rare. It is not desirable to disable the portion of memory in the case of a soft error because it is not caused by a defect and therefore is unlikely to affect future performance. In the present embodiment, error detection logic 120 detects the error in portion of the memory 111S which has experienced a soft error. Error tracking logic 131 begins tracking the errors detected for portion 111S. Because soft error events are extremely rare, it is unlikely that a subsequent error will be detected for portion 111S. Defect determination control logic 132 may require more than a single error on a portion of memory before it is determined that it is a defective portion. Therefore if only a single soft error occurs in portion 111S and defect determination control 132 requires more than one to determine a defect exists, portion 111S will not be designated as defective. Memory control logic 140 will not remove the data from portion 111S and will not restrict future accesses to portion 111S.

Figure 2:
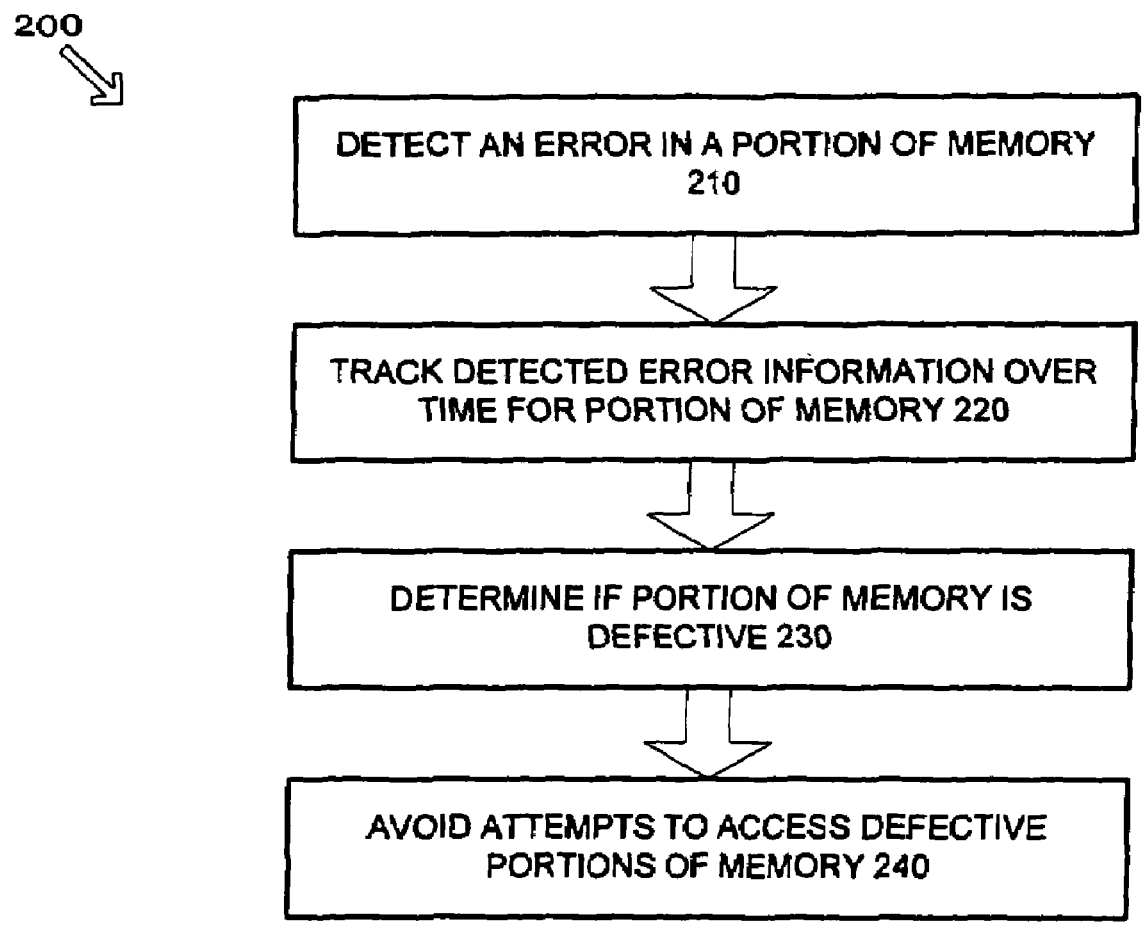
FIG. 2 shows an operational flow diagram of one embodiment of disabling portions of memory with non-deterministic errors.

Referring to FIG. 2, an operational flow diagram 200 of one embodiment of the present invention is shown. In operation block 210, an error is detected in a portion of memory. For instance, error detection logic 120 (FIG. 1) detects an error in 111E of memory 110. In operational block 220, the error information for portions of the memory 111E is tracked over time. For example, the address of 111E containing a detected error is stored along with a count of the number of times an error has been detected for portion 111E. Other embodiments might include the frequency of the errors, the total number of errors, or the number of errors in a given set, way, or other portion of the memory as part of the error information. Operational block 230 determines if the portion of memory is defective based on the error information stored in the error tracking logic 131 and hardware and/or software based limits. Then stores data for that portion of memory indicating a defect. For example, it may be determined that portion 111E of memory is defective based on detecting two errors over time. This means that portion 111E has experienced more than one error which is unlikely to be the result of two random soft errors and can safely be considered either a hard or erratic error. Data is stored indicating that portion 111E of the memory 111 is defective. Next, operational block 240 moves the data in the designated defective portion of memory and restricts future access based on the stored data designating the portion of memory as defective. For example, the data in portion 111E of the memory may be moved to main memory and access to portion 111E for future accesses (either reads or writes) is prohibited. Other embodiments might move the data to a replacement portion of memory (such as a backup or replacement cache line).

Figure 2A:
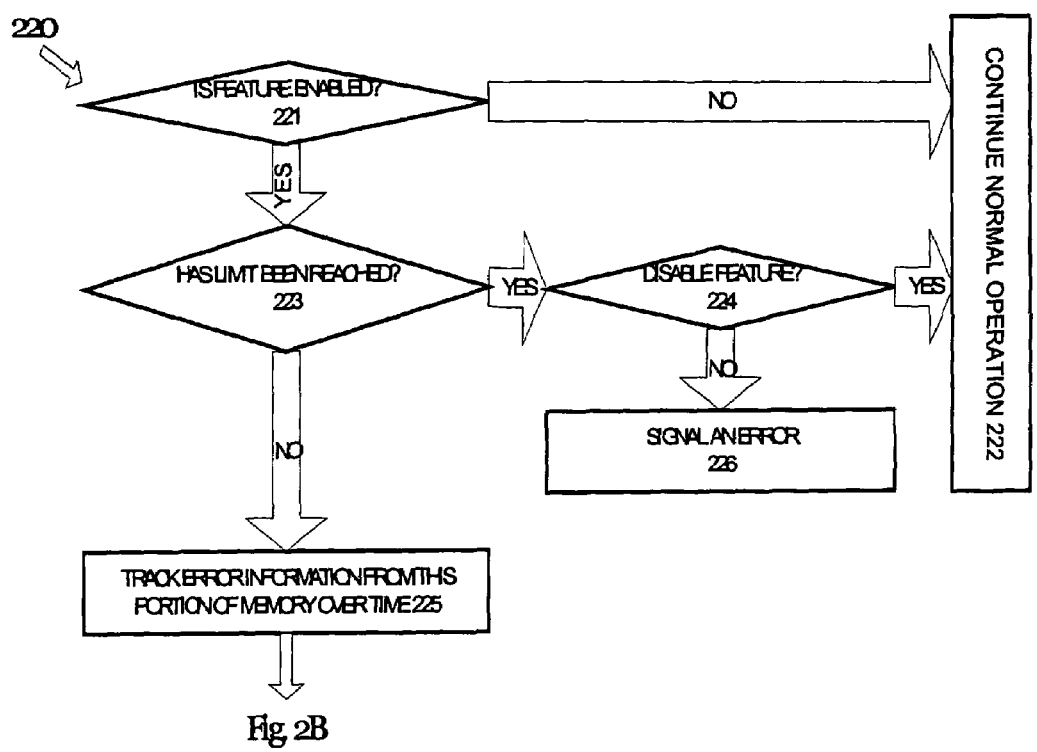
FIGS. 2A-2C shows operational flow diagrams providing details regarding how the operation blocks in FIG. 2 are implemented in accordance with the one embodiment.
Figure 2B:
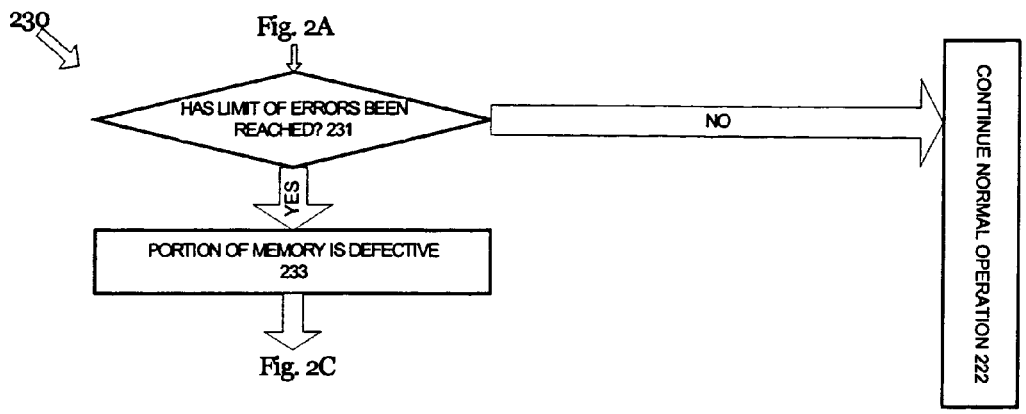
Figure 2C:
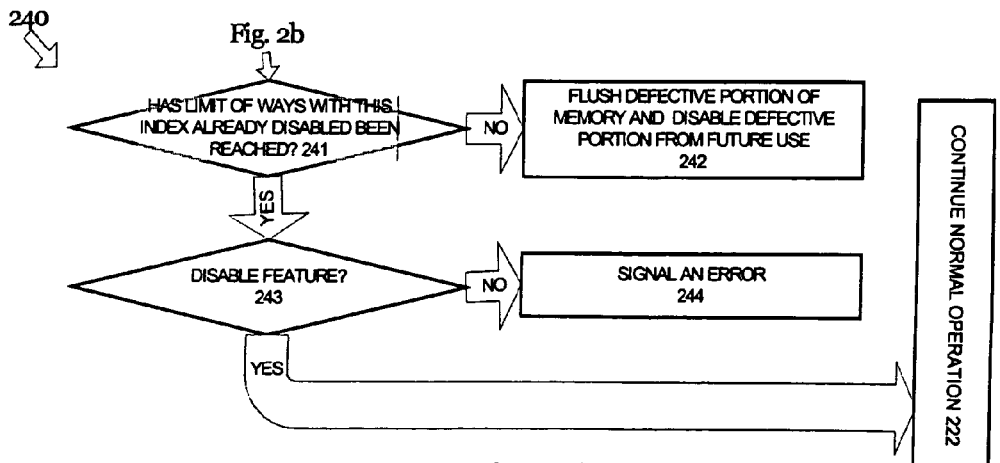

FIGS. 2A-2C illustrate an operational flow diagram showing further details of how the operational blocks in FIG. 2 are implemented in accordance with one embodiment of the present invention. Initially, an ECC correctable error is detected via ECC detection. Next, as shown in FIG. 2A, the error information for portions of the memory is tracked over time. In particular, it is determined if the "feature" is enabled or in use 221. If the feature is not enabled, normal operation continues 222.

If the feature is enabled, it is determined if an upper limit of the number of portions of the memory in which errors have been detected has been reached 223. This determination could be made by looking up the number of memory locations in which errors have been detected and are being tracked by the error tracking block 131 and comparing with the upper limit. This limit could be determined by hardware or software input and could change over time. If this limit has been reached, it is determined if it is allowable to disable the feature 224. This determination could be based on hardware or software inputs. If it is not allowable to disable the feature, an error is sent to the system 226 indicating that the limit has been reached. This error could be sent via an interrupt to the system or other signaling technique. If it is allowable to disable the feature, normal operation continues 222.

If the upper limit of the number of portions of the memory in which errors have been detected has not been reached according to operational block 223, tracking of the number of errors detected in the portion of memory experiencing the error is begun if it is the first error detected for that portion of memory 225. For every subsequent error detected in that portion of memory, a count of the number of errors experienced is incremented. In order to track the number of errors for a portion of memory, the address of the portion of memory and the count of the number of errors are stored. If the memory is a set associative cache, the index and the way make up the address of the defective portion of memory and are stored to specify the portion of memory where the error was found. Other embodiments may additionally indicate smaller portions of a cache line such as a single bit or group of bits that experienced the error. Other cache implementations commonly known in the art may require different address information to specify the portion of memory with the error. If it is determined that it is not the first error for the portion of memory with a detected error, the stored count of the number of errors which have occurred over time to this portion of memory is incremented.

The system then needs to determine if the portion of memory with the detected error is defective 230. Referring to FIG. 2B, the number of errors stored for the portion of memory with the detected error is compared to an upper limit 231. This limit could be one or more, and could be hardware or software controlled. If the upper limit has not been reached, normal operation continues without designating the portion of the memory defective or disabling it 222. If the upper limit has been reached, the portion of the memory is determined to be defective 233. Data is stored indicating the portion of memory is defective and operation moves to FIG. 2C to avoid attempts to access the defective portion of memory.

In one embodiment of the present invention, the memory maybe a set associative cache with multiple ways of associatively. This should not limit the breadth of the present invention as it can be seen that a set associative cache is not a requirement of the present invention. However, in an embodiment of the present invention which includes a set associative cache as part of the memory, it may be desirable to limit the number of ways per set that can be disabled in order to not hinder performance. Referring to FIG. 2C, operational block 241 determines if the maximum limit of ways for the given index in a set associative memory design has already been disabled. This limit may be hardware or software controlled. If the limit has not been reached, the portion of memory determined to be defective in operational block 230 is flushed and then disabled in 242. Flushing the portion of memory means to move the data in the defective portion of memory to another location, for example the main memory. Future access to the defective portion of memory can then be prevented by accessing the data stored indicating that the portion of memory is defective.

If the maximum number of ways in a set has already been disabled, it is determined in operational block 243 if the present invention should be disabled. This can be determined by either software or hardware inputs. If it is acceptable to disable the feature, then the feature is disabled and normal operation continues 222. If it is not acceptable to disable the feature, an error is sent to the system via interrupt or other signaling method 244.

Figure 3:
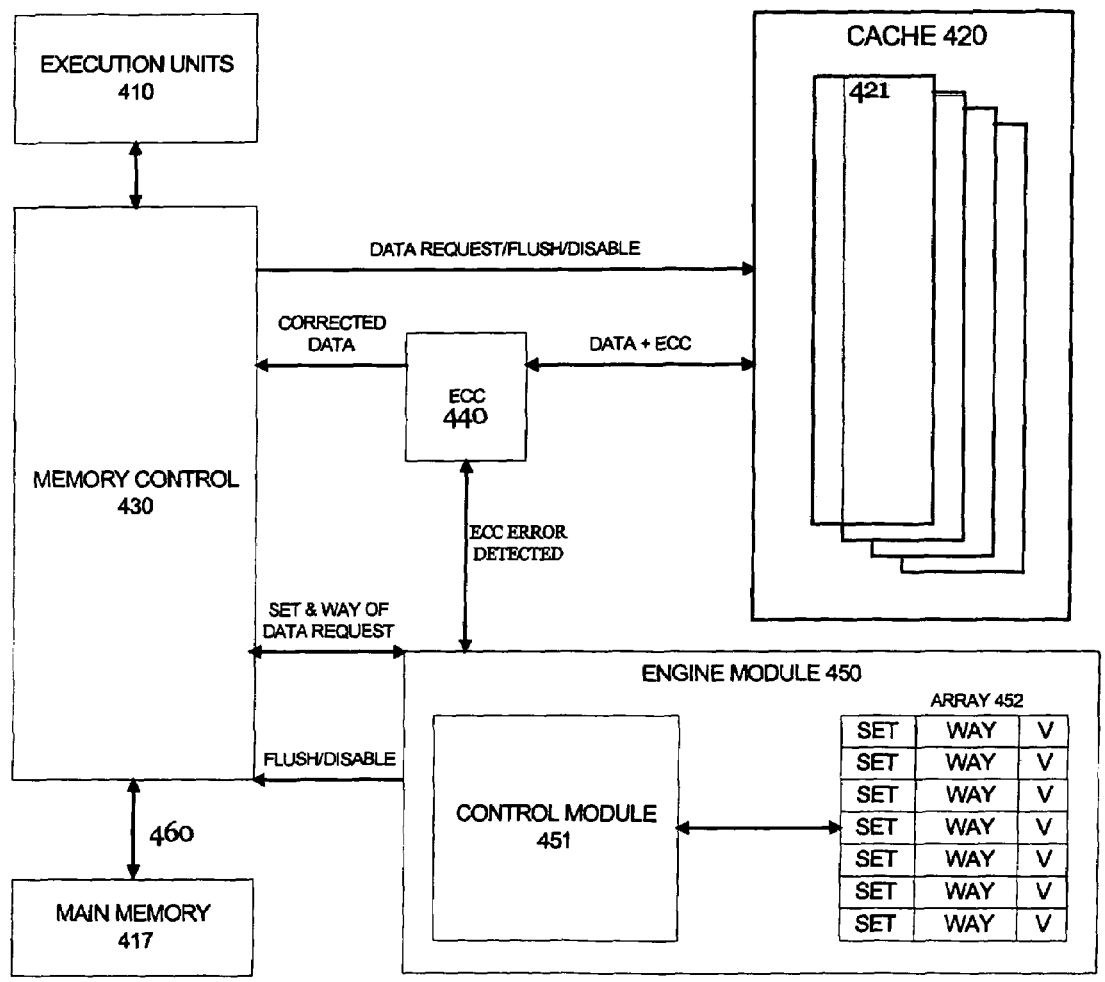
FIG. 3 shows a block diagram of a detailed embodiment of disabling portions of memory with non-deterministic errors.

FIG. 3 is a block diagram further illustrating the present invention. The exemplary embodiment contained in FIG. 3 is provided merely for illustrative purposes and represents how the present invention could be used in a microprocessor. Of course, embodiments of the present invention are not limited in application to the exemplary system shown in FIG. 3, but may be readily employed in various other systems using other cache or memory designs as those of ordinary skill in the art will appreciate.

FIG. 3 includes execution units 410 of a microprocessor. A memory control 430 is operable to control memory access between the execution units 410, a cache 420, and a main memory 417 (via system bus 460). The cache 420 may be a 4 way set associative cache as part of the memory system of a microprocessor.

The memory control 430 requests data from the cache 420. If the data is in the cache, the data and ECC bits for that data are read out to an ECC detection/correction block 440. In this embodiment, the ECC correction is a flow through design and thus in the case of a single bit error on the data, the data is corrected and sent to the memory control 430. Additionally, if such a detected single bit error occurs, the ECC correction/detection block 440 sends an "ECC Error Detected" signal to an engine module 450.

In such a design, a physical portion of the memory (a cache line) can be completely specified with the set information (index) and the way information. For example, an index of "0001" and way "2" could specify the first entry (set) in way 2. Each set and way location in the cache contains data bits and ECC bits corresponding to the data therein. In this implementation a single bit correction and double bit detection algorithm is used to generate the ECC bits corresponding to the data, to check the data for single or double bit errors, and to correct the data in the case of a single bit error. Error correction/detection algorithms of this nature are commonly known to those skilled in the art and are therefore not described in detail herein. The engine module 450 is operable to track the errors coming from a portion of the cache 420 as detected by the ECC correction/detection block 440 and to determine if a portion of the cache is defective.

The engine module 440 contains a control module 451 and an array 452. When an "ECC Error Detected" signal is received by the control 451, it checks to see if the set and way information for the portion of memory with the error has already been stored in the array 452. The array 452 contains set, and way information, as well as a valid bit. The valid bit indicates if the data in the set and way portion of the entry in the array is valid, or that an error for the stored set and way has already been recorded. If the array 452 is full (all entries in the array have their valid bit set), an error can be sent to the system through the memory control 430 or the engine module 450 can be disabled.

This embodiment therefore detects if the array is full to determine if an upper limit has been reached on the number of portions of memory that have seen errors. Other embodiments might use other hardware or software inputs to set such a limit. If the array is not full (e.g. not all entries have the valid bit set), the control 451 compares the set and way information of each entry in the array 452 with valid entries (i.e., entries with the valid bit set) to the set and way information from the portion of the cache with the error. If there is no match, this is the first ECC error on this set and way. The set and way information is then stored in an entry in the array 452 and the valid bit is set in that entry.

This embodiment uses a limit of 2 errors to determine if a portion of the cache should be disabled. However, it should be noted that other amounts on the limit of errors may be incorporated. If during a future access to the same set and way in the cache a second error is detected, ECC 440 again corrects the data and relays the corrected data to the memory control 430. Additionally, the "ECC Error Detected" signal is sent to the engine 450. The control 451 again compares the set and way information from the portion of memory determined to have an error to the set and way information in all valid entries in the array 452. This time, if a match exists, indicating that this error is the second error on the specified set and way. Therefore, for this embodiment, this second error on a given set and way in the cache is used by the control 451 to determine that the cache line specified by the set and way is defective.

It may hinder performance to disable too many ways of a set in a set associative cache. Therefore, upon concluding that a portion of the cache specified by the set and way is defective, the current embodiment determines if that portion of the cache be disabled based on how many valid entries exist in the array 452 with the same set information. In the current embodiment if two or more ways in the set is already determined to be defective, the control 451 will signal an error to the system.

If two or more ways in the same set are not already designated as defective, it is safe to disable the defective cache line.

Signals are sent from the control module 451 to the memory control 430 requesting that the data in the defective portion of memory specified by the set and way information be flushed from the cache 420 and the cache line disabled. In this embodiment, the cache line is disabled by setting a "disable" bit in the cache itself. Each entry (set and way) position in the cache contains a disable bit 421 that stores the disable information. The mechanism for disabling the cache line in other embodiments however is not limited to this implementation. Once a cache line is disabled, the memory control 430 prevents further attempts to write or read from the defective cache line.

In another embodiment of the current invention, the error tracking and defect determination may be done in software or firmware. In this embodiment, a microprocessor with an integrated cache is connected to a system bus. The microprocessor further includes ECC logic operable to detect and/or correct errors in the cache. If correctable error is detected by the ECC logic, information is sent to the system via the system bus indicating which portion of the cache contained the error. This information may include set and way information for a set associative cache, or other information required to specify the portion of memory experiencing the error. Additional information might also include the bit in the set and way experiencing the error. This information is stored in the memory hierarchy of the system.

Using software, the system tracks information about the errors in portions of the cache over time. Portions of the cache could include set and way information for a set associative cache, and may also include smaller portions of the cache including a single bit location or location of a group of bits. This information could include the number of errors encountered per portion of memory, the frequency of the errors, or the timing of the errors from an external event (such as a reset). This information could also include the number of ways in a particular set that have already been determined to be defective in a set associative cache and the total number of errors detected in the memory.

Using software, the system can then determine if the portion of the cache experiencing the error should be considered defective. Such a determination is based on the error information stored for that portion of cache and limits built into the software. Such limits may include the number of allowed failures in a portion of memory over time, the frequency of such failures, the timing of such failures from an external event such as a reset, the total allowed number of disabled portions of memory in the cache, or the total number of disabled portions (ways) of memory in a set in a set associative cache. These limits may change over time. For example, one embodiment may have an error limit of one until the first three failures are detected, and then change to an error limit of two. Such a strategy might be employed if the first few errors are not expected to be soft errors based on the statistical probability of soft errors occurring first.

Once the software has determined that an ECC error should be considered a defect in a portion of the cache, the defective portion is disabled and the data therein flushed to main memory or moved to a replacement portion of the cache. This embodiment employs a bit in the hardware of the cache to indicate that a line in the cache is defective. The software can send a disable instruction to the microprocessor's memory controller which will then disable the defective line. Once such a bit is set in the defective cache line, the memory control 430 of the processor will avoid attempts to access that portion of the cache in the future.

Figure 4:
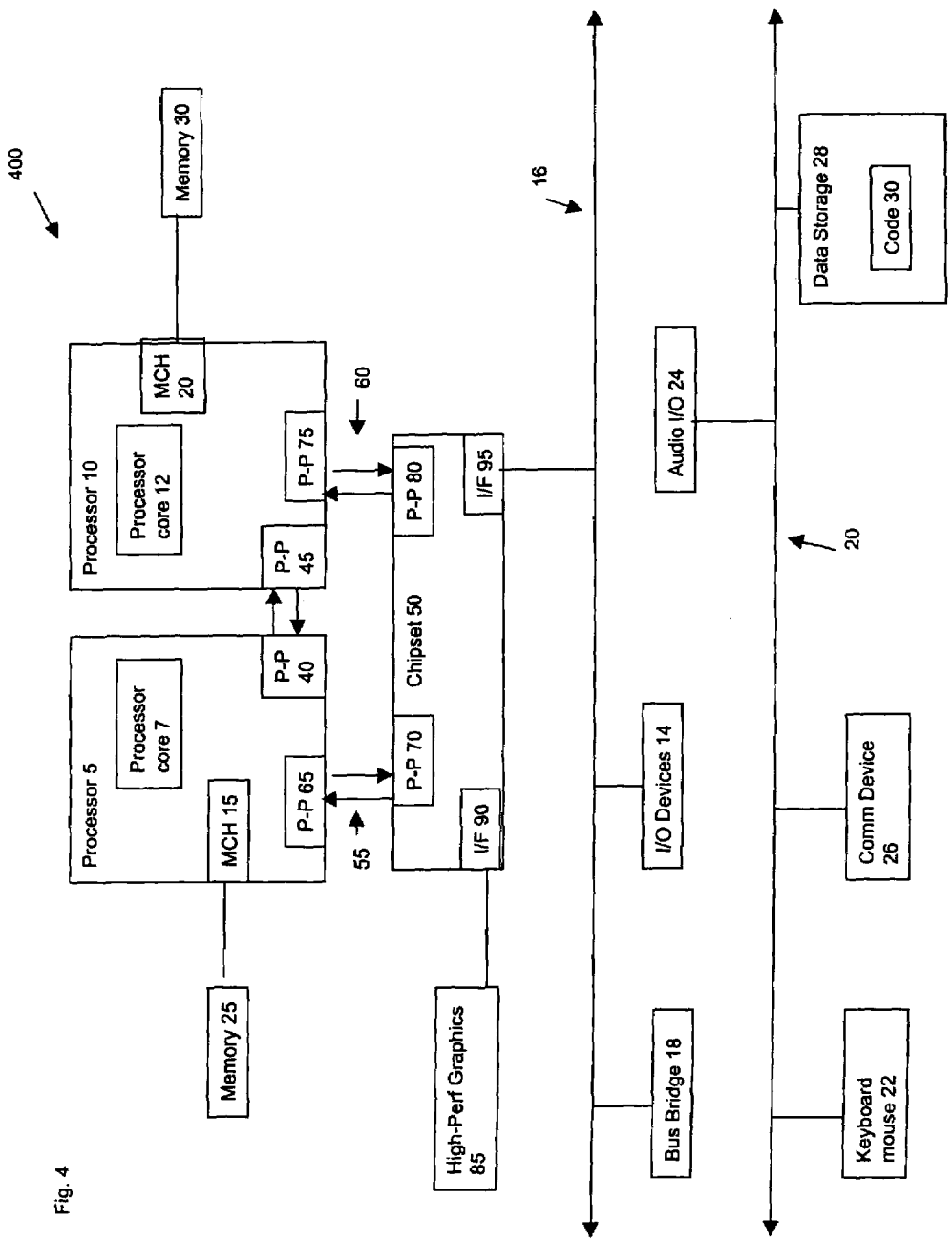
FIG. 4 shows a schematic diagram of a system including processors, which disable portions of memory with non-deterministic errors according to one embodiment.

Referring now to FIG. 4, the system 400 includes processors supporting disabling portions of memory with non-deterministic errors. The system 400 generally shows a system where processors, memory, and input/output devices are interconnected by a number of point-to-point interfaces. The system 400 may also include several processors, of which only two, processors 5, 10 are shown for clarity. Each processor 5, 10 may each include a processor core 7, 12, respectively. Processors 05, 10 may each include a local memory controller hub (MCH) 15, 20 to connect with memory 25, 30. Processors 5, 10 may exchange data via a point-to-point interface 35 using point-to-point interface circuits 40, 45. Processors 5, 10 may each exchange data with a chipset 50 via individual point-to-point interfaces 55, 60 using point to point interface circuits 65, 70, 75, 80. Chipset 50 may also exchange data with a high-performance graphics circuit 85 via a high-performance graphics interface 90.

The chipset 50 may exchange data with a bus 16 via a bus interface 95. In either system, there may be various input/output I/O devices 14 on the bus 16, including in some embodiments low performance graphics controllers, video controllers, and networking controllers. Another bus bridge 18 may in some embodiments be used to permit data exchanges between bus 16 and bus 20. Bus 20 may in some embodiments be a small computer system interface (SCSI) bus, integrated drive electronics (IDE) bus, or a universal serial bus (USB) bus. Additional I/O devices may be connected with bus 20. These may include keyboard and cursor control devices 22, including mouse, audio I/O 24, communications devices 26, including modems and network interfaces, and data storage devices 28. Software code 30 may be stored on data storage device 28. In some embodiments, data storage device 28 may be a fixed magnetic disk, a floppy disk drive, an optical disk drive, a magneto-optical disk drive, a magnetic tape, or non-volatile memory including flash memory.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
    tracking a number of errors associated with a cache location of a cache memory within a processor;
    determining if the cache location includes a defect based on the number of errors and an error limit, wherein the error limit is variable over time;
    after determining that the cache location includes the defect, determining if it is allowable to disable the cache location, including determining an amount of cache locations disabled within a set, determining if the amount of cache locations disabled within the set has reached a limit of cache locations within the set capable of being disabled, and determining it is allowable to disable the cache location in response to determining that the amount of cache locations disabled has not reached the limit of cache locations capable of being disabled within the set; and
    disabling the cache location in response to determining the cache location includes the defect and determining it is allowable to disable the cache location.

2. The method of claim 1 wherein tracking a number of errors associated with a cache location comprises tracking the number of errors associated with the cache location from a reset event for the processor.

3. The method of claim 2 wherein tracking the number of errors associated with the cache location from a reset event for the processor comprises tracking the number of errors associated with the cache location from the reset event in a hardware table within the processor, the hardware table to hold addressing information for the cache location associated with a count for the number of errors associated with the cache location.

4. The method of claim 2 wherein determining if the cache location includes a defect based on the number of errors and the error limit comprises determining if the number of errors associated with the cache location from the reset event has reached an upper limit of errors, and determining the cache location includes the defect in response to determining the number of errors has reached the upper limit.

5. The method of claim 1 wherein the cache location is a way within a set of the cache, and wherein the limit of cache locations capable of being disabled is half of a number of ways within the set.

6. The method of claim 5 further comprising not disabling the way within the set of the cache in response to determining it is not allowable to disable the cache location responsive to determining the amount of ways within the set disabled has reached the limit of half of the number of ways within the set.

7. The method of claim 1 further comprising flushing the cache location before disabling the cache location in response to determining the cache location includes the defect and determining it is allowable to disable the cache location, and wherein disabling the cache location comprises restricting future accesses to the cache location.

8. A hardware apparatus comprising:
    an error detection module to detect a first error upon a first access to a cache location within a cache memory of a processor and a subsequent error upon a subsequent access to the cache location, the first and subsequent accesses being separated by a plurality of accesses to the cache location that do not exhibit errors;
    an error tracking module coupled to the error detection module to track a count of errors including the first error and the subsequent error associated with the cache location from a reset event of the processor;
    a defect determination module coupled to the error tracking module to determine whether the cache location includes a defect in response to the count of errors reaching a limit of errors; and
    a memory control module coupled to the defect determination module to disable the cache location in response to the defect determination module determining the cache location includes a defect and determining that it is allowable to disable the cache location, wherein the memory control module is further to move data held in the cache location to a replacement location within the cache memory before disabling the cache location in response to the defect determination module determining the cache location includes a defect.

9. The hardware apparatus of claim 8 wherein the memory control module is further to flush the cache location before disabling the cache location.

10. The hardware apparatus of claim 8 wherein the error tracking module is to restart the count of errors upon the reset event of the processor.

11. The hardware apparatus of claim 8 wherein the error detection module to detect the first error and the subsequent error includes hardware to receive Error Correction Code (ECC) signals to indicate the first error was detected upon the first access to the cache location and the subsequent error was detected upon the subsequent access to the cache location.

12. The hardware apparatus of claim 8 wherein the defect determination module is further to determine if it is allowable to disable the cache location in response to the count of errors reaching the limit of errors, and wherein the memory control module to disable the cache location in response to the defect determination module determining the cache location includes a defect is further responsive to the defect determination module determining it is allowable to disable the cache location.

13. The hardware apparatus of claim 12 wherein the defect determination module to determine if it is allowable to disable the cache location comprises the defect determination module to:
    determine if a number of currently disabled cache locations has reached a limit of cache locations capable of being disabled in the cache memory,
    determine it is allowable to disable the cache location in response to determining the number of currently disabled cache locations has not reached the limit of cache locations capable of being disabled in the cache memory, and
    determine it is not allowable to disable the cache location in response to determining the number of currently disabled cache locations has reached the limit of cache locations capable of being disabled in the cache memory.

14. The hardware apparatus of claim 13, wherein the limit of cache locations capable of being disabled in the cache memory is defined by hardware, and wherein the limit of errors is defined by software.

15. An article of manufacture comprising program code which, when executed by a machine, causes the machine to perform the operations of:
    receiving error detection information for a cache in a processor of the machine from error detection logic in the processor;
    tracking, in a data structure, errors associated with a portion of the cache over time based on the error detection information received from the error detection logic;
    determining if the portion of the cache is defective based on the errors associated with the portion of the cache tracked in the data structure and an error limit, wherein the error limit is variable over time;
    after determining that the cache portion includes the defect, determining if it is allowable to disable the cache portion, including determining if a limit of disabled cache lines within a set including the cache portion has been reached, and determining it is allowable to disable the cache portion if the limit of disabled cache lines within the set including the cache portion has not been reached; and
    initiating a disable operation, when executed by the processor of the machine, to disable the portion of the cache conditioned upon determining the portion of the cache is defective.

16. The article of manufacture of claim 15, wherein determining if the portion of the cache is defective based on the errors associated with the portion of cache tracked in the data structure and the error limit comprises determining the portion of cache is defective in response to the errors associated with the portion of cache reaching an upper limit of errors.

17. The article of manufacture of claim 16, wherein the portion of the cache is a cache line of the cache.

18. The article of manufacture of claim 17, wherein the disable operation includes a disable instruction, and wherein initiating the disable instruction, when executed by the processor of the machine, to disable the cache line conditioned upon determining the cache line is defective comprises: the processor executing the disable instruction to update a bit corresponding to the cache line to indicate the cache line is defective conditioned upon determining the cache line is defective.

19. The article of manufacture of claim 15 wherein the tracking includes keeping a cumulative count of a number of errors associated with the portion of the cache over time from a reset event of the machine.

20. The article of manufacture of claim 19, wherein the error detection logic comprises Error Correction Code (ECC) logic.

21. The method of claim 1, further comprising varying the error limit after detection of a first number of errors.

22. The article of manufacture of claim 15, further comprising program code that causes the machine to vary the error limit after detection of a first number of errors.

23. The method of claim 1, further comprising if it is not allowable to disable the cache location, sending an error to indicate that the limit has been reached.

24. The method of claim 1, further comprising if it is not allowable to disable the cache location, disabling the tracking and determining.

25. The method of claim 1, further comprising setting a disable indicator of the cache location to disable the cache location.

26. The method of claim 1, wherein the error limit is at a first level until a first number of defects have been determined, and thereafter the limit is at a second level greater than the first level.

* * * * *